US011749588B2

(12) United States Patent
Derai et al.

(10) Patent No.: US 11,749,588 B2
(45) Date of Patent: Sep. 5, 2023

(54) SEMICONDUCTOR DEVICE AND CORRESPONDING METHOD

(71) Applicant: STMicroelectronics S.r.l., Agrate Brianza (IT)

(72) Inventors: Michele Derai, Milan (IT); Roberto Tiziani, Nerviano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 234 days.

(21) Appl. No.: 17/120,996

(22) Filed: Dec. 14, 2020

(65) Prior Publication Data

US 2021/0183752 A1 Jun. 17, 2021

(30) Foreign Application Priority Data

Dec. 17, 2019 (IT) ........................ 102019000024259

(51) Int. Cl.
*H01L 23/498* (2006.01)
*H01L 21/48* (2006.01)
*H01L 21/56* (2006.01)
*H01L 23/31* (2006.01)

(52) U.S. Cl.
CPC .... *H01L 23/49805* (2013.01); *H01L 21/4839* (2013.01); *H01L 21/565* (2013.01); *H01L 23/3107* (2013.01); *H01L 23/49866* (2013.01)

(58) Field of Classification Search
CPC ........... H01L 23/49805; H01L 21/4839; H01L 21/565; H01L 23/3107; H01L 23/49866
USPC .......................................................... 257/676
See application file for complete search history.

(56) References Cited

U.S. PATENT DOCUMENTS

2011/0079885 A1* 4/2011 Camacho .......... H01L 23/49541 257/676
2016/0343643 A1 11/2016 Hishiki et al.
2019/0189574 A1* 6/2019 Kramp .................... H01L 24/06

FOREIGN PATENT DOCUMENTS

JP H11087602 A 3/1999
JP 2012174966 A 9/2012
JP 2017045945 A 3/2017

OTHER PUBLICATIONS

IT Search Report and Written Opinion for IT Appl. No. 102019000024259 dated Aug. 14, 2020 (9 pages).

* cited by examiner

*Primary Examiner* — Caleb E Henry
*Assistant Examiner* — Dilinh P Nguyen
(74) *Attorney, Agent, or Firm* — CROWE & DUNLEVY

(57) ABSTRACT

A semiconductor device comprises at least one semiconductor die electrically coupled to a set of electrically conductive leads, and package molding material molded over the at least one semiconductor die and the electrically conductive leads. At least a portion of the electrically conductive leads is exposed at a rear surface of the package molding material to provide electrically conductive pads. The electrically conductive pads comprise enlarged end portions extending at least partially over the package molding material and configured for coupling to a printed circuit board.

14 Claims, 3 Drawing Sheets

10 54 50 54 100 12 44 56 14 44 12 12 44 56 14 44 12 44 10 54 50 54

SEMICONDUCTOR DEVICE AND CORRESPONDING METHOD

PRIORITY CLAIM

This application claims the priority benefit of Italian Application for Patent No. 102019000024259, filed on Dec. 17, 2019, the content of which is hereby incorporated by reference in its entirety to the maximum extent allowable by law.

TECHNICAL FIELD

The description relates to manufacturing semiconductor devices.

One or more embodiments may be applied to manufacturing integrated circuits (ICs).

BACKGROUND

Semiconductor devices such as integrated circuits may be provided with packages of various types. For instance, quad-flat no-leads (QFN) packages and land grid array (LGA) packages are examples of surface-mount technology (SMT) packages known in the art.

QFN packages are near chip-scale plastic encapsulated packages provided with a planar leadframe substrate, wherein perimeter lands on the package rear (e.g., bottom) side are configured to provide electrical connections to a printed circuit board (PCB). The leads of the leadframe are thus fully incorporated in the package molding compound. QFN packages may include an exposed thermal pad to improve heat transfer out of the integrated circuit, into the printed circuit board.

LGA packages also have leads fully incorporated in the package molding compound, and comprise a (rectangular) grid of contacts on the bottom side of the package. The contacts on the package are configured to be coupled to a grid of contacts on the PCB.

Both QFN and LGA packages (as well as other SMT packages) do not have external leads, but rather have "lands" or "pads" that are directly couplable to the PCB pads for soldering by means of solder paste or solder alloy. The mounting (soldering) step may be complex and may result in a wide variability of welding strength and structure. Additionally, the different coefficients of thermal expansion between the package and the printed circuit board may lead to high stress in the solder material and/or to high thermal fatigue of QFN/LGA packages once mounted on a printed circuit board.

In this context, the use of "wettable flanks" is known in the art. Wettable flanks help increase wettability of the leads with the purpose of improving solder adhesion and overall welding strength by increasing the solder attachment area on the vertical side of the lands or pads. Wettable flanks may only slightly improve the solder joint reliability, and facilitate automatic optical inspection of the solder joint after the surface mounting process, for surface mount process control.

Packaged semiconductor devices providing improved solder joint reliability and/or stronger anchorage to the PCB are desirable.

There is a need in the art to contribute in providing packaged semiconductor devices, e.g., comprising a QFN- or LGA-type package, with improved solder joint reliability and/or stronger anchorage to the printed circuit board.

SUMMARY

One or more embodiments may relate to a semiconductor device (e.g., an integrated circuit).

One or more embodiments may relate to a corresponding method of manufacturing semiconductor devices.

One or more embodiments may provide a packaged semiconductor device (e.g., comprising a QFN or LGA package) comprising at least one semiconductor die electrically coupled to a set of electrically conductive leads, and package molding material molded over the at least one semiconductor die and the electrically conductive leads. At least a portion of the electrically conductive leads may be exposed at a rear surface of the package molding material to provide electrically conductive pads. The electrically conductive pads may comprise enlarged end portions extending at least partially over the package molding material and configured for coupling to a printed circuit board.

BRIEF DESCRIPTION OF THE DRAWINGS

One or more embodiments will now be described, by way of example only, with reference to the annexed figures, wherein.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The references used herein are provided merely for convenience and hence do not define the extent of protection or the scope of the embodiments.

Figure 1:
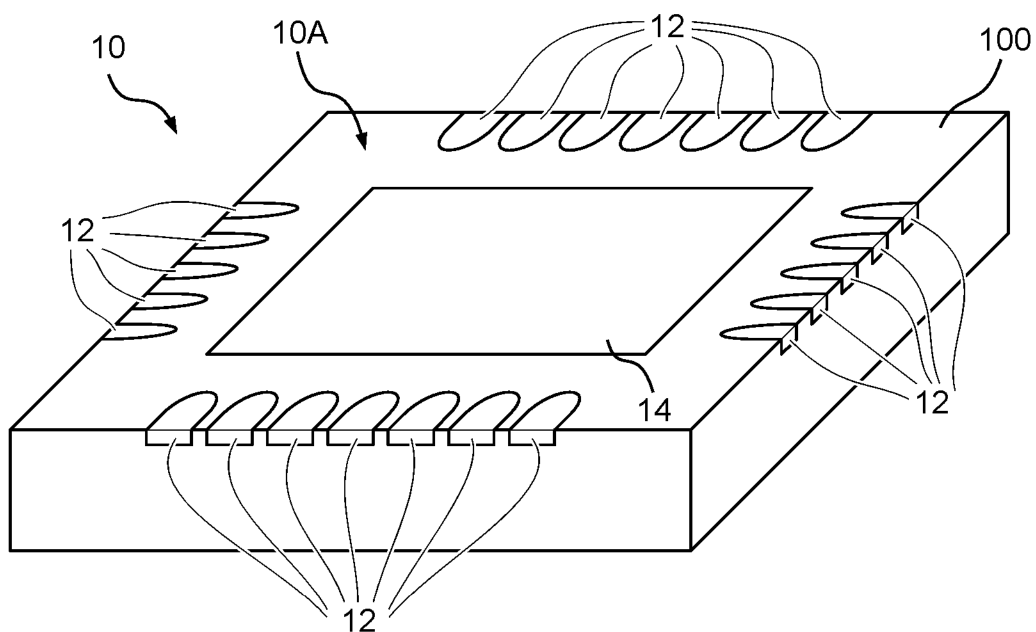
FIG. 1 is a perspective view exemplary of a semiconductor device comprising a QFN package, shown upside-down (i.e., with the rear side facing upwards)
Figure 2:
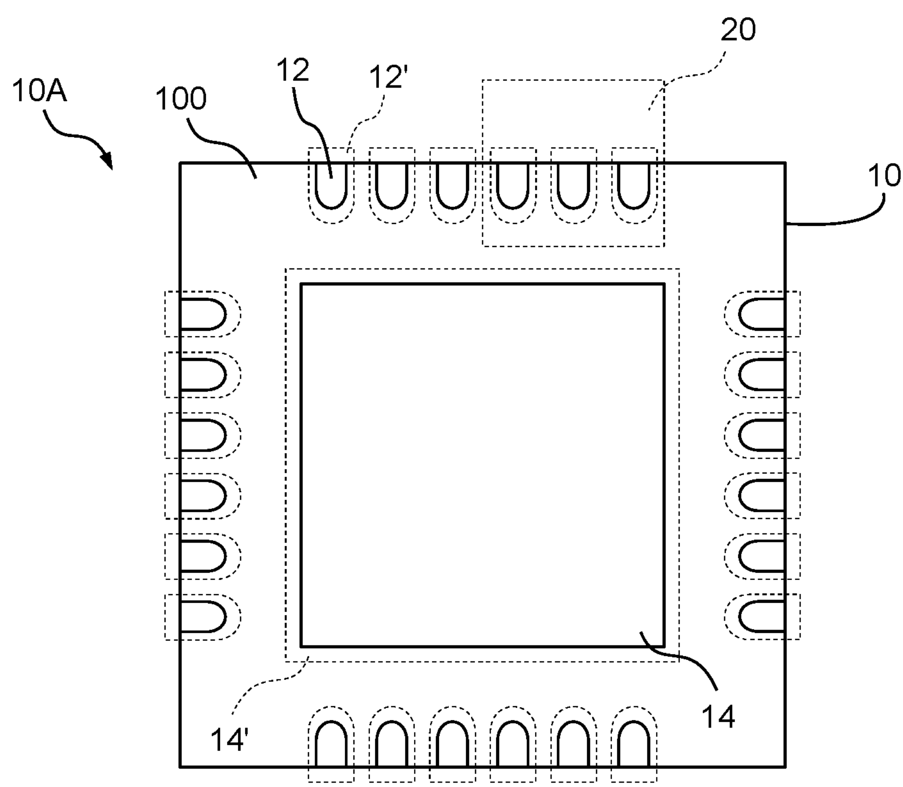
FIG. 2 is a view of the rear side of the semiconductor device of FIG. 1.

By way of introduction to the detailed description of exemplary embodiments, reference may be first had to FIGS. 1 and 2, which are exemplary of a semiconductor device 10 comprising a QFN package.

While reference is made mainly to QFN packages in the present description and drawings for the sake of conciseness, one or more embodiments may be applied to other types of "leadless" packages, e.g., LGA packages.

As current in the art, together with other elements/features not visible in the Figures, a semiconductor device 10 as exemplified herein may comprise package molding material 100 encapsulating a semiconductor die (not visible in FIGS. 1 and 2), the molding material 100 being shaped to provide a rear (e.g., bottom) side 10A of the semiconductor device 10 configured for electrical and mechanical coupling to a printed circuit board.

A set of electrically conductive "lands" or "pads" 12 may be provided on the rear (or bottom) side 10A, e.g., at the periphery thereof, as illustrated in FIGS. 1 and 2. Additionally or alternatively, the pads 12 may be arranged over the entire area of the rear side 10A, as customary in LGA packages. The pads 12 may be electrically coupled to the semiconductor die encapsulated in the molding material 100.

Optionally, the package may include an exposed thermal pad 14 on the rear side 10A. The thermal pad 14 may be thermally coupled to the semiconductor die encapsulated in the molding material 100 to improve heat transfer out of the integrated circuit 10.

Overall, the electrical pads 12 and the thermal pad 14 may provide the leadframe of the integrated circuit 10.

The (minimum) spacing between two adjacent pads 12 may be constrained by manufacturing constraints of the leadframe. Typically, the corresponding solder pads on a PCB may be wider and/or less spaced. For instance, FIG. 2 shows a bottom view of an exemplary integrated circuit 10 having electrical pads 12 and a thermal pad 14 (illustrated with solid lines), and a corresponding exemplary arrangement of solder pads 12' and 14' as may be present on a printed circuit board configured for coupling to the integrated circuit 10.

Figure 3A:
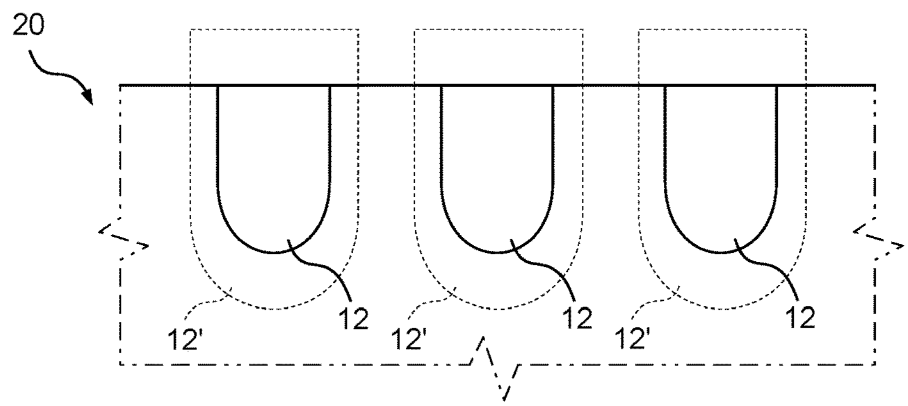
FIG. 3A is a magnified view of a portion of the rear side of the semiconductor device of FIG. 2.
Figure 3B:
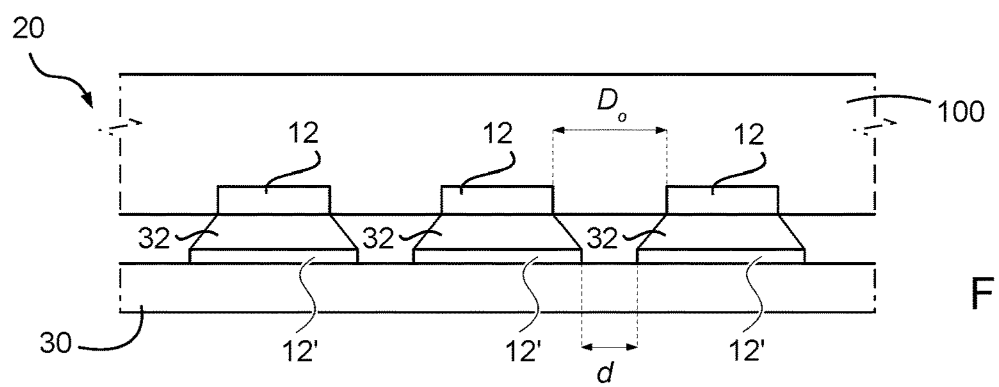
FIG. 3B is a side view of the portion of the semiconductor device of FIG. 3A mounted on a printed circuit board.

FIG. 3A is a magnified view exemplary of a portion of the rear side 10A of the integrated circuit 10, e.g., portion 20 illustrated in FIG. 2. FIG. 3B is a corresponding side view of portion 20, exemplary of the integrated circuit 10 mounted on a printed circuit board 30 by means of soldering material 32 interposed between the electrical pads 12 of the integrated circuit 10 and the respective solder pads 12' on the PCB 30.

It is noted that, as a consequence of the spacing $D_o$ between pads 12 being (considerably) larger than the spacing d between pads 12', electro-mechanical coupling of the integrated circuit 10 to the PCB 30 may turn out to be unsatisfactory.

Figure 4A:
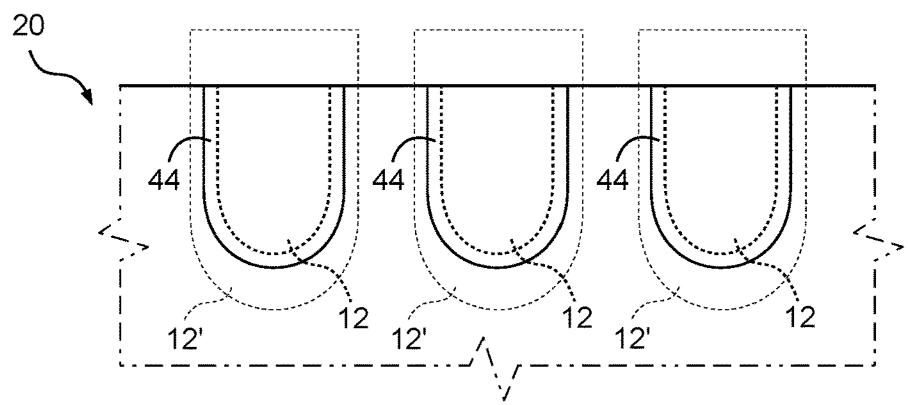
FIG. 4A is a magnified view of a portion of the rear side of a semiconductor device according to embodiments.
Figure 4B:
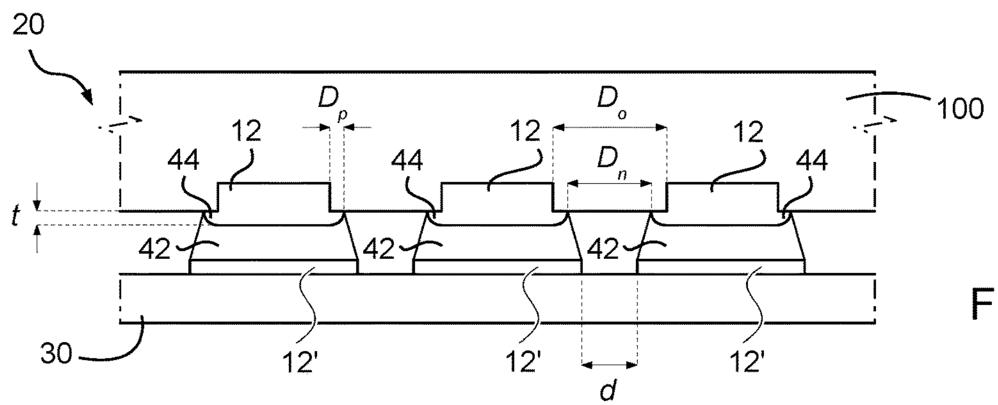
FIG. 4B is a side view of the portion of the semiconductor device of FIG. 4A mounted on a printed circuit board.

In one or more embodiments as exemplified in FIGS. 4A and 4B, reliability of such electro-mechanical coupling may be improved by increasing the area of the electrical pads 12 of the integrated circuit 10.

FIG. 4A is a magnified view exemplary of a portion 20 of the rear side 10A of an integrated circuit 10 according to one or more embodiments. FIG. 4B is a corresponding side view of portion 20, exemplary of the integrated circuit 10 mounted on a printed circuit board 30 by means of soldering material 42.

As exemplified herein, a metallic layer may be selectively provided at the pads 12 after molding of the package material 100 to provide enlarged end portions 44 of the pads. The enlarged end portions 44 may thus partially extend over the molding material 100 at the interface between the pads 12 and the molding material 100 (e.g., "sidewise" of the body portion 12 of the pads which are embedded in the molding material), thereby increasing the area of the pads suitable for electrical and/or mechanical coupling to the soldering pads 12'.

Therefore, in one or more embodiments, a (thick) "pedestal" of metal material may be grown over the surface of the pads 12 and/or 14 left exposed by the molding material 100, thereby providing larger pads (i.e., providing a reduced spacing $D_n$ between pads 12, which increase the soldering surface) and an increase of the standoff between the semiconductor package 100 and the printed circuit board 30. As a result, solder joint reliability may be improved and/or a stronger anchorage of the integrated circuit to the PCB may be obtained.

In one or more embodiments, the enlarged end portions 44 may be provided (e.g., grown) over the pads 12 and/or 14 after molding of the package material 100 by means of galvanic plating.

Providing the enlarged end portions 44 by galvanic plating may be advantageous insofar as it may facilitate growing the metal 44 (sidewise) over the molding compound 100 at the interface between the pads 12 and/or 14 and the molding compound 100, i.e., it may facilitate properly increasing the area of the pads (as exemplified in FIG. 4B).

Additionally or alternatively, any other selective metal deposition technique that would result in an isotropic growth of metal at the pads 12 and/or 14 may be used to form the enlarged portions 44.

In one or more embodiments, the thickness of the enlarged end portions 44 may be in the range of 10 μm to 100 μm, preferably 50 μm to 70 μm.

In one or more embodiments, the enlarged end portions 44 may extend (sidewise) over the molding compound 100 from the interface between the respective body portion of pad 12 and/or 14 and the molding compound 100 (see length $D_p$ in FIG. 4B) for about 10 μm to 100 μm, preferably 50 μm to 70 μm.

In one or more embodiments, the enlarged end portions 44 may comprise at least one metal selected out of copper (Cu), nickel (Ni), palladium (Pd) and gold (Au). Preferably, the enlarged end portions 44 comprise copper (Cu).

In one or more embodiments, a further metallic layer may be provided over the enlarged end portions 44. For instance, the further metallic layer may comprise tin (Sn) plated over the enlarged end portions 44 at the pads 12 and/or 14.

One or more embodiments may provide improved reliability (e.g., longer life on board) over previous solutions, e.g., over solutions involving wettable flanks.

FIGS. 5A to 5G are exemplary of possible steps of a method of manufacturing semiconductor devices according to one or more embodiments. In FIGS. 5A-5G, manufacturing of a pair of semiconductor devices in exemplified.

Figure 5A:
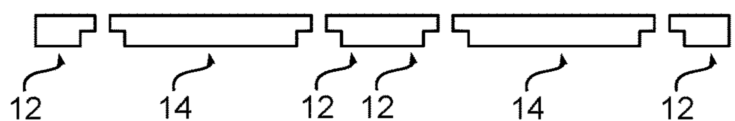
FIGS. 5A to 5G are exemplary of steps of a method of manufacturing semiconductor devices according to embodiments.

As exemplified in FIG. 5A, an otherwise conventional leadframe may be provided as a first manufacturing step. For each semiconductor device, the leadframe may comprise a die pad 14 and respective leads 12.

Figure 5B:
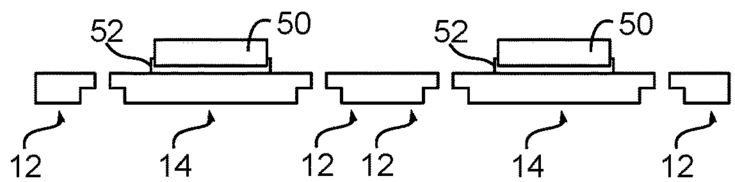

As exemplified in FIG. 5B, at least one semiconductor die 50 may be mounted on each die pad 14 of the leadframe. For instance, the semiconductor dies 50 may be attached on the die pads 14 via die attach material 52, e.g., soft-solder die attach material and/or glue.

Figure 5C:
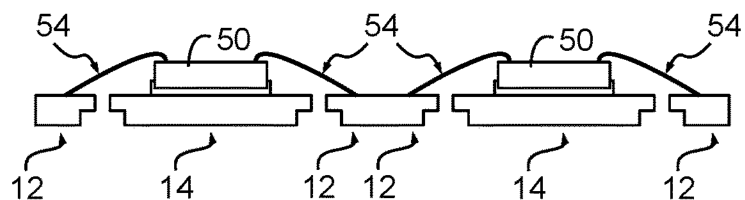

As exemplified in FIG. 5C, wire bonding may be carried out to provide electrical coupling between a semiconductor die 50 and the respective leads 12 via bonding wires 54.

Figure 5D:
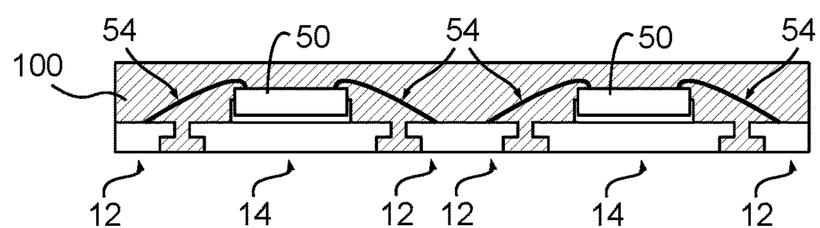

As exemplified in FIG. 5D, package molding material 100 may be molded to encapsulate the semiconductor dies 50 and the leadframe, leaving exposed the electrical pads 12 and the thermal pads 14 at the rear side of the semiconductor devices.

Figure 5E:
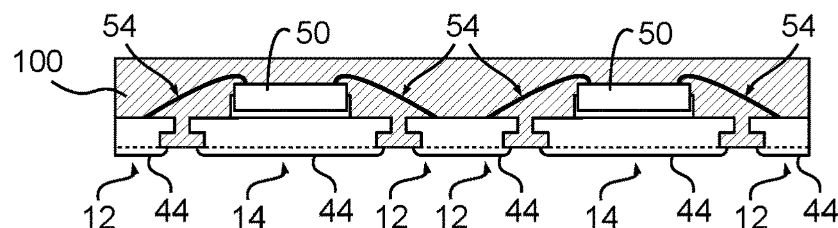

As exemplified in FIG. 5E, a metallic layer 44 may be provided at the pads 12 and/or 14 after molding of the package material 100, thereby providing metallic "bumps" (the enlarged end portions) at the package leads. The enlarged end portions 44 may be grown, for instance, by galvanic plating. The thickness (t) of the enlarged end portions 44 may be in the range of 10 μm to 100 μm, preferably 50 μm to 70 μm. The lateral extension ($D_p$) of the enlarged end portions 44 may be in the range of 10 μm to 100 μm, preferably 50 μm to 70 μm. The enlarged end portions 44 may comprise one or more metals selected out of copper (Cu), nickel (Ni), palladium (Pd) and gold (Au).

Figure 5F:
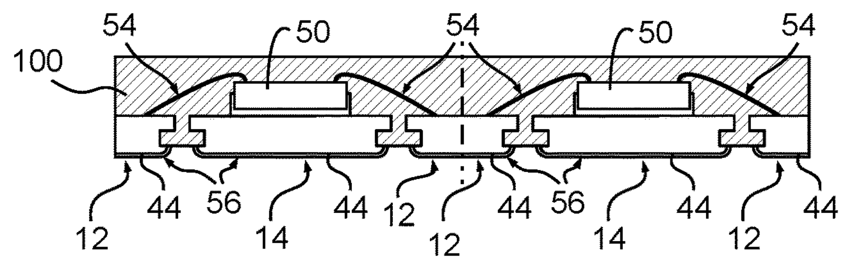

As exemplified in FIG. 5F, a further metallic layer 56 may be provided over the metallic layer 44, e.g., by plating. The further metallic layer 56 may comprise tin (Sn).

Figure 5G:
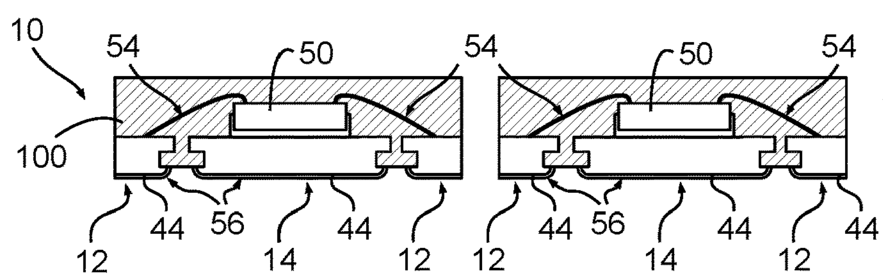

As exemplified in FIG. 5G, the manufacturing method may comprise singulating the semiconductor devices 10, e.g., by cutting or sawing along sawing lines, as conventional in the art.

As exemplified herein, a semiconductor device (e.g., 10) may comprise: at least one semiconductor die (e.g., 50) electrically coupled (e.g., 54) to a set of electrically conductive leads; and package molding material (e.g., 100) molded over the at least one semiconductor die and the electrically conductive leads, wherein at least a portion of the electrically conductive leads is exposed at a rear surface (e.g., 10A) of the package molding material to provide electrically conductive pads (e.g., 12, 44).

As exemplified herein, the electrically conductive pads may comprise enlarged end portions (e.g., 44) extending at least partially over the package molding material, the enlarged end portions configured for coupling to a printed circuit board (e.g., 30).

As exemplified herein, the electrically conductive pads may comprise body portions (e.g., stem portions or web portions 12) embedded in the package molding material and the enlarged end portions may protrude from the package molding material.

As exemplified herein, the enlarged end portions may extend over the package molding material sidewise of said body portions for a length (e.g., $D_p$) of 10 μm to 100 μm, preferably 50 μm to 70 μm.

As exemplified herein, the enlarged end portions may comprise galvanic plating grown material.

As exemplified herein, the enlarged end portions may comprise at least one metal selected out of copper, nickel, palladium and gold, preferably copper.

As exemplified herein, a thickness (e.g., t) of the enlarged end portions may be in the range of 10 μm to 100 μm, preferably 50 μm to 70 μm.

As exemplified herein, a semiconductor device may comprise a metallic layer (e.g., 56) plated over the enlarged end portions. The metallic layer may comprise tin.

As exemplified herein, a semiconductor device may comprise a thermally conductive pad (e.g., 14). The thermally conductive pad may comprise a respective enlarged end portion extending at least partially over the package molding material and configured for coupling to a printed circuit board.

As exemplified herein, a semiconductor device may comprise a quad-flat no-lead package or a land grid array package.

As exemplified herein, a method may comprise: providing a leadframe comprising at least one die pad and at least one respective set of electrically conductive leads; mounting at least one semiconductor die onto the at least one die pad; electrically coupling the at least one semiconductor die to electrically conductive leads in the respective at least one set of electrically conductive leads; molding package molding material onto the at least one semiconductor die and the leadframe, the package molding material exposing at least a portion of the electrically conductive leads at a rear surface of the package molding material to provide electrically conductive pads; and providing enlarged end portions of the electrically conductive pads extending at least partially over the package molding material, the enlarged end portions configured for coupling to a printed circuit board.

Without prejudice to the underlying principles, the details and embodiments may vary, even significantly, with respect to what has been described by way of example only, without departing from the extent of protection.

The claims are an integral part of the technical teaching provided herein in respect of the embodiments.

The extent of protection is defined by the annexed claims.

The invention claimed is:

1. A method, comprising:

providing a leadframe comprising at least one die pad and at least one respective set of electrically conductive leads;

mounting a semiconductor die onto said at least one die pad;

electrically coupling the semiconductor die to electrically conductive leads in the respective at least one set of electrically conductive leads;

molding package molding material onto the semiconductor die and the leadframe, the package molding material exposing at least a portion of the electrically conductive leads at a rear surface of the package molding material to provide electrically conductive pads; and providing enlarged end portions of the electrically conductive pads extending at least partially over the rear surface of the package molding material, wherein the enlarged end portions are configured for coupling to a printed circuit board;

wherein providing the enlarged end portions comprises, after molding package molding material onto the semiconductor die and the leadframe;

plating conductive material onto the electrically conductive pads, with the plated conductive material laterally extending in contact with the rear surface of the package molding material.

2. A method, comprising:

providing a leadframe comprising at least one die pad and at least one respective set of electrically conductive leads;

mounting a semiconductor die onto said at least one die pad;

electrically coupling the semiconductor die to electrically conductive leads in the respective at least one set of electrically conductive leads;

molding package molding material onto the semiconductor die and the leadframe, the package molding material exposing at least a portion of the die pad at a rear surface of the package molding material to provide a thermally conductive pad; and providing an enlarged end portion of the thermally conductive pad extending at least partially over the rear surface of the package molding material, wherein the enlarged end portion is configured for coupling to a printed circuit board;

wherein providing the enlarged end portion comprises, after molding package molding material onto the semiconductor die and the leadframe;

plating conductive material onto the thermally conductive pad, with the plated conductive material laterally extending in contact with the rear surface of the package molding material.

3. A method, comprising:

providing a leadframe comprising at least one die pad and at least one respective set of electrically conductive leads;

mounting at least one semiconductor die onto said at least one die pad;

electrically coupling the at least one semiconductor die to electrically conductive leads in the respective at least one set of electrically conductive leads;

molding package molding material onto the at least one semiconductor die and the leadframe, the package molding material exposing at least a portion of the electrically conductive leads at a rear surface of the package molding material to provide electrically conductive pads that comprise body portions embedded in the package molding material; and after said molding, galvanic plating the electrically conductive pads to provide a plating layer that forms enlarged end portions of the electrically conductive pads, wherein the plating layer for the enlarged end portions protrudes from the package molding material and extends on a back surface of the package molding material sidewise of said body portions for a length, and wherein the enlarged end portions are configured for coupling to a printed circuit board.

4. The method of claim 3, wherein the length is in a range of 10 μm to 100 μm.

5. The method of claim 3, wherein the length is in a range of 50 μm to 70 μm.

6. The method of claim 3, wherein said plating layer is made of a material selected from the group consisting of nickel, palladium and gold.

7. The method of claim 3, wherein said enlarged end portions are made of copper.

8. The method of claim 3, wherein a thickness of said plating layer is in a range of 10 μm to 100 μm.

9. The method of claim 3, wherein a thickness of said plating layer is in a range of 50 μm to 70 μm.

10. The method of claim 3, further comprising plating a metallic layer over said plating layer.

11. The method of claim 10, wherein said metallic layer is made of tin.

12. The method of claim 3, wherein said leadframe comprises a thermally conductive pad, the method further comprising, after said molding, galvanic plating the thermally conductive pad to provide the plating layer which forms a respective enlarged end portion of the thermally conductive pad, wherein the plating layer extends on the back surface of the package molding material, and wherein the respective enlarged end portion is configured for coupling to said printed circuit board.

13. The method of claim 3, further comprising providing a quad-flat no-lead package.

14. The method of claim 3, further comprising providing a land grid array package.

* * * * *